United States Patent [19]

Neidig et al.

[11] Patent Number: 4,639,759
[45] Date of Patent: Jan. 27, 1987

[54] POWER TRANSISTOR MODULE

[75] Inventors: Arno Neidig, Plankstadt; Bernd Leukel, Weinheim; Lutz Bergmann, Lampertheim, all of Fed. Rep. of Germany

[73] Assignee: Brown, Boveri & Cie., AG, Mannheim, Fed. Rep. of Germany

[21] Appl. No.: 550,910

[22] Filed: Nov. 10, 1983

[30] Foreign Application Priority Data

Nov. 10, 1982 [DE] Fed. Rep. of Germany ....... 3241509

[51] Int. Cl.[4] .................. H01L 23/02; H02G 13/08
[52] U.S. Cl. .......................................... 357/74; 357/75; 357/80; 174/16 HS; 174/52 FP
[58] Field of Search ................ 357/72, 74, 75, 80; 174/52 FP, 16 HS; 361/386–389

[56] References Cited

U.S. PATENT DOCUMENTS

| | | | |
|---|---|---|---|
| 4,047,197 | 9/1977 | Schierz | 357/80 |
| 4,115,838 | 9/1978 | Yagusic et al. | 357/74 |
| 4,218,695 | 8/1980 | Egerbacher et al. | 357/75 |
| 4,249,034 | 2/1981 | Fichot et al. | 357/81 |
| 4,335,392 | 6/1982 | Reiter | 357/75 |
| 4,488,167 | 12/1984 | Neidig et al. | 357/80 |
| 4,518,982 | 5/1985 | DuBois et al. | 357/75 |
| 4,530,003 | 7/1985 | Blair et al. | 357/80 |

Primary Examiner—William L. Sikes
Assistant Examiner—Frank González
Attorney, Agent, or Firm—Herbert L. Lerner; Laurence A. Greenberg

[57] ABSTRACT

A power transistor module includes a housing having a frame forming a housing wall and a ceramic plate fastened to the frame forming a housing bottom, structured metallizations disposed on the ceramic plate forming conductor runs and terminal pads, components including at least one power transistor and a bypass diode connected to the terminal pads, wiring elements being connected to the components and being freely accessible from the top of the housing, the wiring elements including an auxiliary collector terminal, and an auxiliary diode connected between the auxiliary collector terminal and the collector electrode of the power transistor.

4 Claims, 4 Drawing Figures

POWER TRANSISTOR MODULE

BACKGROUND OF THE INVENTION

1. Field of the Invention

The invention relates to a power transistor module, including a plastic frame used as the housing wall, a ceramic plate used as the housing bottom, structured metallizations on the housing bottom serving as conductor runs and terminal pads for one or more power transistors and bypass diodes, and wiring elements which are freely accessible from the top of the housing.

Such power transistor modules are generally known in the art.

2. Description of the Prior Art

Semiconductor components such as transistors which can be switched off, have shorter switching times than thyristors with forced quenching, and therefore permit higher switching frequencies. They can be employed to advantage in d-c control elements, d-c transformers, inverters and frequency converters for drives, and they permit the control of the energy flow between a nearly constant d-c voltage source and consumers with variable d-c and a-c voltage.

In order to drive power transistors, it is logical to provide an electrical connection to the collector terminal of the power transistor, as can be seen, for instance, from the publication by Lamboley, entitled "Intelligenter Baustein steuert and schützt Leistungs-Transistor" (Intelligent Building Block Which Controls and Protects A Power Transistor), Elektronik 16, Aug. 13, 1982, pages 27 to 29, FIGS. 1 and 5. In the conventional case, an integrated module for monitoring and controlling the switching processes of the power transistor is employed. The use of such an integrated module is made difficult, however, because the auxiliary diode must still be incorporated in the integrated module as a discrete component between the terminals of the power transistor module.

SUMMARY OF THE INVENTION

It is accordingly an object of the invention to provide a power transistor module which overcomes the hereinafore-mentioned disadvantages of the heretofore-known devices of this general type, and which is suitable for direct connection to integrated modules serving as drivers.

With the foregoing and other objects in view there is provided, in accordance with the invention, a power transistor module, comprising a housing having a frame forming a housing wall and a ceramic plate fastened to said frame forming a housing bottom, structured metallizations disposed on said ceramic plate forming conductor runs and terminal pads, components including at least one power transistor and a bypass diode or diodes connected to the terminal pads, wiring elements being connected to the components and being freely accessible from the top of the housing, the wiring elements including an auxiliary collector terminal, and an auxiliary diode connected between the auxiliary collector terminal and the collector electrode of the power transistor.

The advantages attainable with the invention are in particular that the voltage which exists due to the incorporation of the auxiliary diode in the module between the auxiliary terminals of the module such as auxiliary emitter, auxiliary collector and base terminal is very small, which permits a close disposition of the auxiliary terminals and therefore a compact construction of the module.

In accordance with another feature of the invention the frame is formed of plastic.

In accordance with an additional feature of the invention the wiring elements include other auxiliary leads forming base and auxiliary emitter terminals.

In accordance with a concomitant feature of the invention the housing has opposite sides, the auxiliary collector terminal, base terminal and auxiliary emitter terminal are disposed at one of the sides outside the top of the housing, and the wiring elements include a common terminal connected to the power transistor and bypass diode disposed at the other of the sides outside the top of the housing.

Other features which are considered as characteristic for the invention are set forth in the appended claims.

Although the invention is illustrated and described herein as embodied in a power transistor module, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS

The construction and method of operation of the invention, however, together with additional objects and advantages thereof will be best understood from the following description of specific embodiments when read in connection with the accompanying drawings in which.

Figure 1:
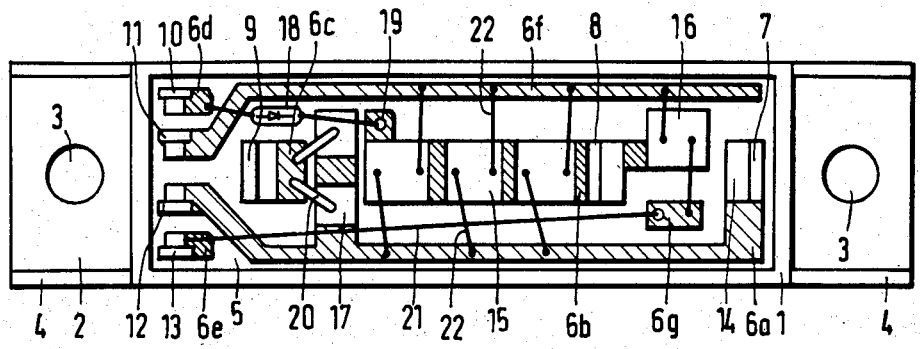
FIG. 1 is a partially cross-sectional top-plan view of a cut-open power transistor module.

Referring now to the figures of the drawing in detail and first, particularly, to FIG. 1 thereof, it is seen that the power transistor module has a narrow rectangular frame 1 which is open at the top and bottom and serves as a housing wall. Fastening lugs 2 are disposed at the two narrow sides of the frame 1 at the level of the bottom of the frame. The lugs have holes 3 formed therein for mounting the module on a heat sink. In order to increase the strength of the frame, stiffening edges 4 are provided between the mounting lugs 2 and the frame 1.

DESCRIPTION OF THE PREFERRED EMBODIMENTS

Figure 2:
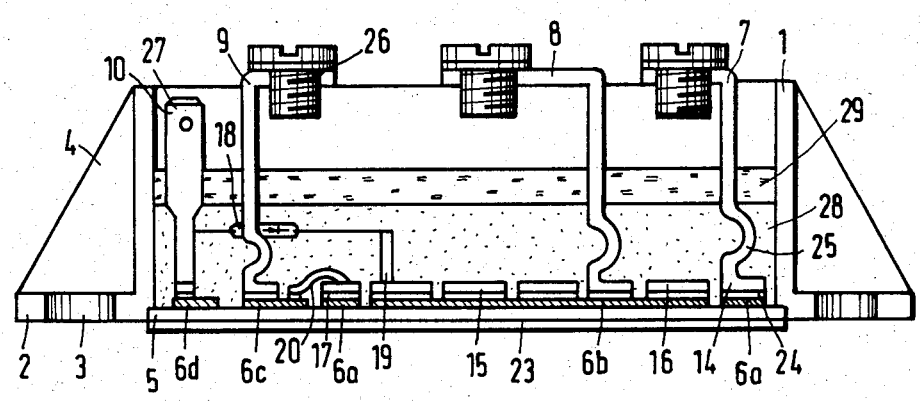
FIG. 2 is a partially cross-sectional view of the wide side of a module.

The housing of the power transistor module is formed, firstly, of the frame 1 and secondly, of a ceramic plate 5 cemented into a depression formed in the lower surface of the open frame 1 (in this connection see FIG. 2 as well). The ceramic plate 5 has metallizations on its surface facing the interior of the housing with a structure according to the circuit shown in FIG. 3 or 4. These metallizations may be copper foils which are applied directly to the ceramic plate 5 and without an intermediate layer such as solder or adhesive, according to a method known from German Published, Non-Prosecuted Application DE-OS No. 30 36 128.5. In detail, an emitter metallization 6a, a collector metallization 6b, a support point metallization 6c for a bypass-diode-anode, an auxiliary collector metallization 6d, a base-1 metallization 6e, a base-2 metallization 6f and a base-1 support point metallization 6g, are provided.

The metallizations mentioned above serve as conductor runs and contact surfaces for soldering-on externally accessible wiring elements, power transistors, a driver transistor, bypass diodes and internal contact pins and connecting wires. The emitter, collector and bypass-diode-anode metallization 6a, 6b and 6c, are respectively soldered to main terminals 7, 8 and 9 for the emitter, the collector and the bypass diode. The respective auxiliary collector, base-2, emitter and base-1 metallizations 6d, 6f, 6a and 6e, respectively, are soldered to the auxiliary terminals 10, 11, 12 and 13, respectively, for the auxiliary collector, the base 2, the emitter and the base 1, respectively. The above-mentioned seven terminal elements 7-13 are externally accessible from the top of the housing and each have an enlarged base part 14 for mechanical stabilization of the solder joints.

The collectors of three parallel-connected power transistors 15 are soldered to the collector metalization 6b. In order to form a Darlington circuit, the collector of a driver transistor 16 is also soldered to the metallization 6b. The cathodes of two parallel-connected bypass diodes 17 are soldered to the emitter metallization 6a.

In order to form the auxiliary collector terminal 10, an auxiliary diode 18 is connected between the auxiliary collector metallization 6d and the collector metallization 6b. The auxiliary diode 18 which is constructed as an axial diode, is soldered or spot-welded on the cathode side to a contact pin 19 and on the anode side to the terminal 10. The contact pins 19 themselves are connected to the corresponding metallizations by soldering.

The support point metallization 6c is connected through soldered contact brackets 20 or by aluminum wire bonded by ultrasound, to the anodes of the bypass diodes 17. A further contact pin 19 is connected to the base-1 support point metallization 6g of the driver transistor 16; the pin serves for connecting a tie wire 21 to the base-terminal 13. The connections of the base electrodes and the emitter electrodes of the power transistors 15 to the base-2 metallizations 6f and the emitter metallization 6a, respectively, are accomplished by connecting wires 22. Similar connecting wires 22 also serve for connecting the emitter and the base of the driver transistor 16 to the base-2 metallization 6f and the base-1 support point metallization 6g. The connecting wires 22 are preferably formed of aluminum and are bonded (by ultrasound bonding).

In FIG. 2, a section through the wide side of a power transistor module is shown. In particular, the figure shows the module housing formed of the frame 1 and the ceramic plate 5 with the formed-on or integral mounting lugs 2 and stiffening edges 4. Besides the internal structured metallizations 6a to 6g, the ceramic plate 5 also has a metallization 23 on the outside thereof. The metallization 23 serves to increase the strength of the ceramic plate 5. The solder layer between the inner metallizations 6a to 6g and the soldered-on components is designated with reference numeral 24.

The structure of the main and auxiliary terminals is particularly clearly seen from FIG. 2. The enlarged base part 14 of the main terminals 7, 8, 9 is followed by an angled-off portion and an expansion arc 25. The expansion arc 25 has a cross section which is smaller than the cross section of the remaining part of the terminal element and serves for absorbing tension stresses of the solder joints between the base 14 and the inner metallization. The expansion arc becomes an angled-off portion with a tapped hole 26 to form a screw connection at its upper end. The auxiliary terminals 10 and 13 are preferably in the form of flat plugs 27 with or without an expansion arc 25.

FIG. 2 also shows the connection of the auxiliary diode 18 as well as the contact of the anode of the bypass diode 17 through the slipped-on contact bracket 20.

The ceramic plate 5 equipped with the semiconductor components and internal as well as external terminals, is cemented in place completing the housing. Subsequently, the lower part of the housing is poured full of a soft casting component 28 (such as silicone rubber) for protection of the sensitive active parts and solder joints. The housing is sealed to a point just above the center of the housing with a hard casting compound 29 (such as epoxy resin). The externally accessible terminals are mechanically stabilized by the hard casting compound 29. The upper part of the housing remains free of casting compound for the external connection of the module and can be covered by means of a cover with cutouts formed therein for the connections.

Besides the above-described connection of the auxiliary diode 18 through the contact pins 19, the diode can also be soldered directly to a metallization provided on the ceramic plate 5. Flat plugs for the main terminal instead of the above-described screw connections are also possible.

Figure 3:
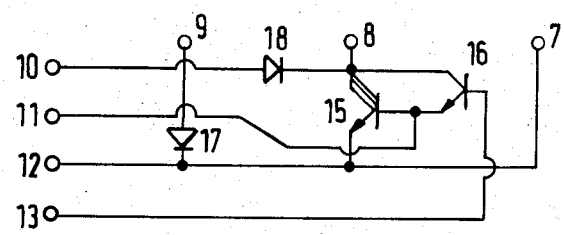
FIG. 3 is a schematic circuit diagram of the internal wiring of the individual components in the interior of the module.

In FIG. 3, the internal wiring of the individual component in the interior of the module is shown. The emitter terminal 7 is connected to the emitters of the power transistor 15, to the cathodes of the bypass diodes 17 and to the auxiliary emitter terminal 12. The collector terminal 8 is connected to the collectors of the power transistors 15 and of the driver transistor 16, as well as to the cathode of the auxiliary diode 18. The anodes of the bypass diodes 17 are connected to the bypass diode terminal 9. The auxiliary collector terminal 10 is connected to the anode of the auxiliary diode 18. The base electrodes of the power transistors 15 and the emitter electrode of the driver transistor 16 are connected to the base-2 terminal 11. The base of the driver transistor 16 is connected to the base-1 terminal 13.

Figure 4:
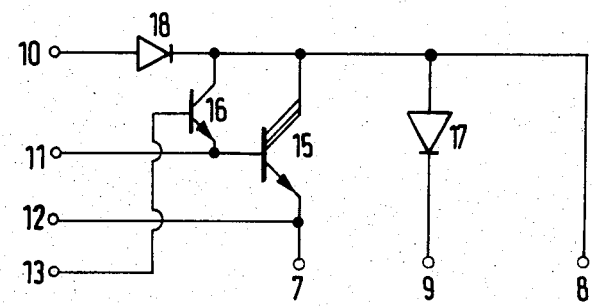
FIG. 4 is a circuit diagram similar to FIG. 3 of another embodiment of the internal wiring in the module.

In FIG. 4, a variation of the internal wiring in the module is shown by means of a circuit diagram. The anode side of the bypass diode 17 is connected in this case to the collector of the transistor 15, to the cathode of the auxiliary diode 18, to the collector of the driver transistor 16 and to the terminal 8. The cathode side of the diode 17 is connected to the terminal 9. The circuits according to FIGS. 3 and 4 are required in pairs for constructing transistor half-bridges. The order of the leads 7, 8 and 9 shown in the drawings, permits simple interconnections by using buses. The tap 7 according to FIG. 3 and the tap 8 according to FIG. 4 connected between the diode 17 and the transistor 15, is always disposed on the outside of the module opposite the auxiliary terminals 10 and 13, so that the connection is more easily accessible for additional circuit components (such as inductances).

The foregoing is a description corresponding in substance to German Application No. P 32 41 509.5, dated Nov. 10, 1982, the International priority of shich is being claimed for the instant application, and which is hereby made part of this application. Any material discrepancies between the foregoing specification and the aforementioned corresponding German application are to be resolved in favor of the latter.

We claim:

1. Power transistor module, comprising a housing having a frame forming a housing wall and a ceramic plate fastened to said frame forming a housing bottom; structured metallizations disposed on said ceramic plate forming conductor runs and terminal pads; components including at least one power transistor having a collector electrode and a bypass diode connected to said terminal pads; wiring elements being connected to said components and being freely accessible from the top of said housing, said wiring elements including an auxiliary collector terminal; and an auxiliary diode connected between said auxiliary collector terminal and the collector electrode of said power transistor.

2. Power transistor module according to claim 1, wherein said frame is formed of plastic.

3. Power transistor module according to claim 1, wherein said wiring elements include base and auxiliary emitter terminals.

4. Power transistor module according to claim 3, wherein said housing has opposite sides, said auxiliary collector terminal, base terminal and auxiliary emitter terminal are disposed at one of said sides outside the top of said housing, and said wiring elements include a common terminal connected to said power transistor and bypass diode disposed at the other of said sides outside the top of said housing.

* * * * *